United States Patent
Sawada et al.

(10) Patent No.: US 7,598,496 B2
(45) Date of Patent: Oct. 6, 2009

(54) CHARGED-PARTICLE BEAM SYSTEM

(75) Inventors: Hidetaka Sawada, Tokyo (JP); Fumio Hosokawa, Tokyo (JP)

(73) Assignee: Jeol Ltd., Tokyo (JP)

(*) Notice: Subject to any disclaimer, the term of this patent is extended or adjusted under 35 U.S.C. 154(b) by 195 days.

(21) Appl. No.: 11/874,604

(22) Filed: Oct. 18, 2007

(65) Prior Publication Data
US 2008/0128635 A1 Jun. 5, 2008

(30) Foreign Application Priority Data
Oct. 20, 2006 (JP) ............................. 2006-287010

(51) Int. Cl.
*H01J 37/14* (2006.01)
(52) U.S. Cl. .................................. 250/396 R
(58) Field of Classification Search ............... 250/396 R
See application file for complete search history.

(56) References Cited

U.S. PATENT DOCUMENTS 6,646,267 B1   11/2003   Haider et al.
6,930,312 B2 *  8/2005   Matsuya et al. ......... 250/396 R

FOREIGN PATENT DOCUMENTS

JP        2001-516139       9/2001

OTHER PUBLICATIONS

Vernon D. Beck, "A Hexapole Spherical Aberration Corrector," Optik 53, No. 4, pp. 241-255 (1979).
A.V. Crewe and D. Kopf, "A Sextupole System for the Correction of Spherical Aberration," Optik 55, No. 1, pp. 1-10 (1980).

* cited by examiner

*Primary Examiner*—Kiet T Nguyen
(74) *Attorney, Agent, or Firm*—The Webb Law Firm (57) ABSTRACT

An aberration for correcting higher-order aberrations with a relatively small number of components is by let N1 being the aberration order at a first location, S1 being the symmetry at the first location, N2 being the aberration order at a second location and S2 being the symmetry at the second location. The produced combination aberration satisfies the following condition set 1 as order=N1+N2−1 and symmetry=|S1+S2| or |S2−S1|. That is two aberration-correcting elements (aberration-introducing elements) corresponding to the first and second locations, respectively. An aberration satisfying the condition set 1 is corrected by making use of the produced combination aberration.

8 Claims, 6 Drawing Sheets

FIG. 1

Hexapole doublet

CHARGED-PARTICLE BEAM SYSTEM

BACKGROUND OF THE INVENTION

1. Field of the Invention

The present invention relates to a charged-particle beam system and, more particularly, to an aberration corrector and method of aberration correction capable of correcting higher-order aberrations.

2. Description of Related Art

Spherical aberration that cannot be corrected with a cylindrical symmetrical lens can be corrected using multipole lenses. Since established, this technology has been rapidly introduced into many practical apparatus. In recent years, excellent practical data derived using electron microscopes (TEMs and STEMs) equipped with aberration correctors have been vigorously published.

Figure 1:
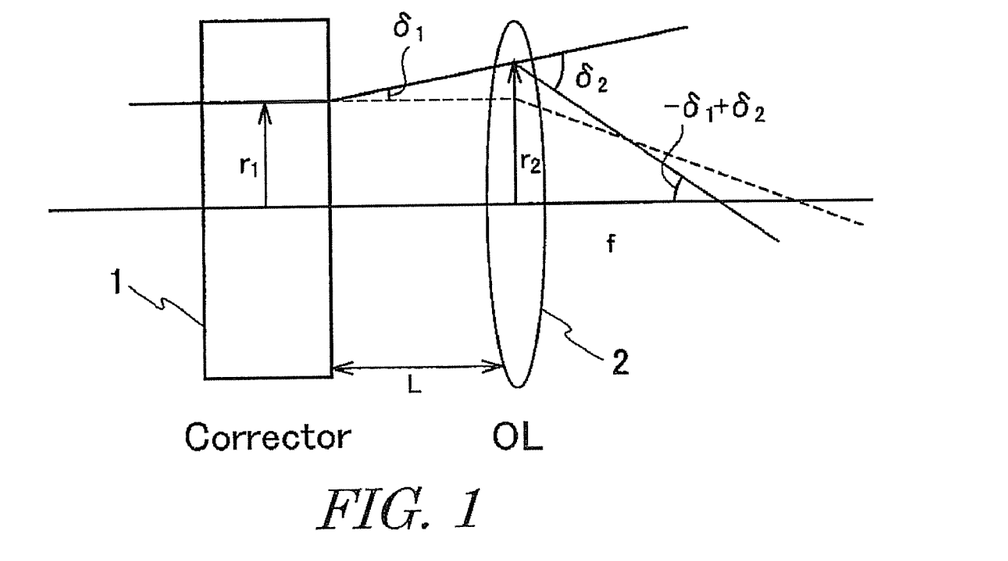
FIG. 1 is a diagram illustrating generation of fifth-order spherical aberration disclosed in V. Beck, *Optik,* 53, 241-255 (1979)

First, a phenomenon in which fifth-order spherical aberrations are created from spherical aberrations in a spherical aberration corrector and in an objective lens is described. FIG. 1 is a diagram illustrating generation of the fifth-order spherical aberrations from spherical aberrations in the spherical aberration corrector and in the objective lens.

In V. Beck, Optik, 53, 241-255 (1979), it is stated that if there is an extra optical distance L between a spherical aberration corrector 1 and a plane at which a correction is made (front or back focal plane of an objective lens 2) as shown in FIG. 1, extra fifth-order spherical aberration ($C_5$) is introduced because the position of the electron beam is shifted at the correction plane. In this paper, the fifth-order aberration is described as issues produced when the spherical aberration corrector 1 is fabricated.

More specifically, because of shift of the position of the electron beam, angles $\delta_1$ and $\delta_2$ given by the following Eqs. (1) and (2) are produced.

$$\delta_1 = C_s \cdot r^3 / f^4 \tag{1}$$

$$\delta_2 = \frac{r_2}{f} + \frac{C_3^2 r_2^3}{f^4} \tag{2}$$

$r_2$ of the objective lens 2 is given by Eq. (3).

$$r_2 = r_1 + C_s \cdot r^3 \cdot L/f^4 \tag{3}$$

Therefore, from Eqs. (1)-(3), a relationship given by the following Eq. (4) is derived.

$$\delta_1 + \delta_2 = \frac{r_2}{f} + \frac{3C_3^2 L}{f^2} \cdot \frac{r_1^5}{f^6} + \text{higher order terms} \tag{4}$$

For example, the extra fifth-order spherical aberration ($C_5$) is introduced in the higher-order terms of Eq. (4).

A modern spherical aberration corrector using transfer lenses is free from the above-described problem because the distance L can be set to 0 by means of the transfer lenses.

Figure 2:
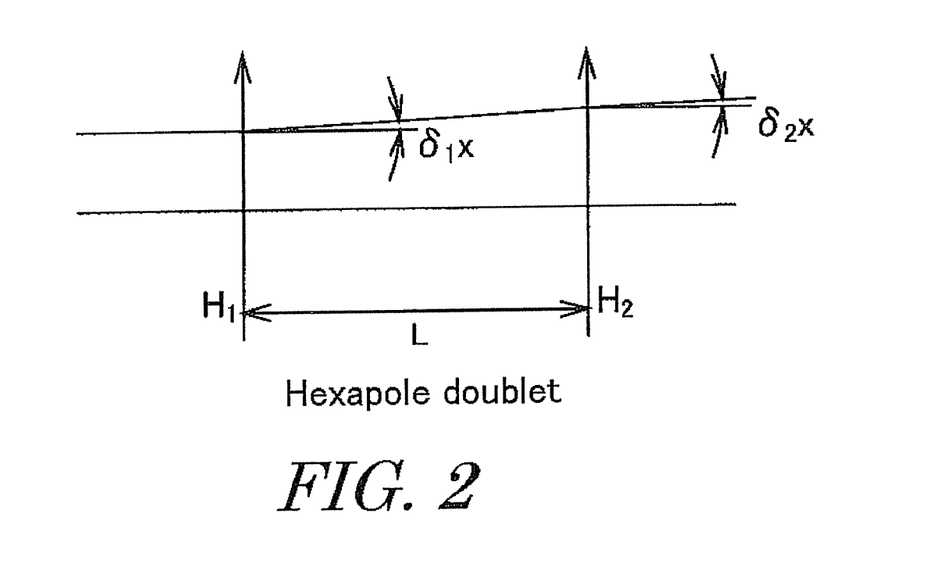
FIG. 2 is a diagram illustrating a method of correcting an aberration using a combination of two thin hexapole elements, the method being disclosed in V. Beck, *Optik,* 53, 241-255 (1979)

A method of correcting spherical aberration using two hexapole fields is now described by referring to FIG. 2, which illustrates a method of correcting spherical aberration using the hexapole fields. In the above-cited reference, Beck also proposes a method of correcting spherical aberration by the use of two hexapole fields. According to Beck, two thin hexapole elements are combined to produce a negative third-order aberration (negative spherical aberration).

FIG. 2 shows that a negative spherical aberration given by Eq. (5) is produced by the combination of thin hexapole elements $H_1$ and $H_2$ which are spaced from each other by a distance of L.

$$\delta_1 x = +H(x_1^2 - y_1^2) \quad \delta_2 x = -H(x_2^2 - y_2^2) \quad \delta_1 y = -2H x_1 y_1$$
$$\delta_2 y = +2H x_2 y_2$$

$$x_2 = x_1 + \delta_1 x L \tag{5}$$

$$y_2 = y_1 + \delta_1 y L$$

$$\delta_1 x + \delta_2 x = -2LH^2(x_1^3 + x_1 y_1^2) + \text{higher order terms}$$

$$\delta_1 y + \delta_2 y = -2LH^2(y_1^3 + y_1 x_1^2) + \text{higher order terms}$$

Eq. (5) gives an example of correction of spherical aberration using a combination of aberrations, though A. V. Crewe and D. Kopf, Optik, 55, 1-10 (1980) states that a negative spherical aberration was created even from a single hexapole element.

JP2001-51613 states a method of removing deformation $\alpha^n$ of an image in an electron optical system. Off-axis image deformations $\alpha^n \gamma^m$ of order n+m which act identically on the deformation $\alpha^n$ are corrected by moving or tilting the beam passage in the direction of the optical axis until compensation of the deformation of the image on the optical axis is completed. Furthermore, in this method, first-, second-, and third-order deformations of the image on the optical axis are corrected by correcting third-order deformation of the image on the optical axis in an electron optical system equipped with hexapole elements.

The aforementioned spherical aberration (in terms of order of geometrical aberration) is the third-order aberration. Even if this is corrected, the target resolution cannot be obtained under the condition where the other aberrations are left. Therefore, it is important to obtain a technique for correcting residual higher-order aberrations. Furthermore, in recent years, even electron microscopes have been required to be made up of a less number of components. Of course, the aberration corrector is required to be made up of a less number of components.

In the method disclosed in the above-cited JP2001-51613, a correction is made while moving or tilting the beam passage in the direction of the optical axis. Consequently, there is the possibility that labor is required to make adjustments for correcting both an aberration to be corrected and residual aberrations.

Especially, in order to correct higher-order aberrations, it is desired that low-order elements be combined, the number of components be reduced, and the correction be made quickly.

SUMMARY OF THE INVENTION

It is an object of the present invention to provide an aberration corrector capable of correcting higher-order aberrations with a relatively small number of components. It is another object of the present invention to provide a method of aberration correction that can be implemented by this aberration corrector.

An embodiment of the present invention solves the above-described problem and provides a charged-particle beam system for correcting aberrations possessed by a lens disposed in the direction of travel of an electron beam. The charged-particle beam system comprises an aberration corrector for correcting lower-order aberrations and at least two aberration-correcting elements spaced apart from each other along a path of travel of the electron beam. A higher-order aberration left in the lens after the lower-order aberrations possessed by the lens have been corrected by the aberration corrector is corrected using a combination aberration created by a combination of aberrations produced in the at least two aberration-correcting elements.

Another embodiment of the present invention provides a charged-particle beam system comprising an aberration corrector for correcting aberrations possessed by a lens disposed in the direction of travel of an electron beam. At least two aberration-correcting elements are disposed in the aberration corrector. There are further provided first and second control units for applying control voltages to the aberration-correcting elements disposed in the aberration corrector. The second control unit produces its control voltage independent of the first control unit in such a way that the control voltage produced by the second control unit can be superimposed on the control voltage which is produced by the first control unit and to be applied to the aberration-correcting elements disposed in the aberration corrector. A higher-order aberration left in the lens after the lower-order aberrations possessed by the lens have been corrected by the control voltage applied by the first control unit is corrected using a combination aberration created by a combination of aberrations produced in the aberration-correcting elements disposed in the aberration corrector by the control voltage applied by the second control unit.

Yet another embodiment of the present invention based on the above-described embodiment comprises: aberration-grasping means for grasping an order and a symmetry of a higher-order aberration that is left in the lens and to be corrected; and aberration-producing means for producing a combination aberration having properties given by an order $(N_1+N_2-1)$ and a symmetry $|S_1+S_2|$ or $|S_2-S_1|$ (where $N_1$ and $S_1$ are an order and a symmetry, respectively, of a geometric aberration produced in a first aberration-correcting element disposed in a front stage along the direction of travel of the electron beam and $N_2$ and $S_2$ are an order and a symmetry, respectively, of a geometric aberration produced in a second aberration-correcting element disposed in a rear stage) by a combination of the orders and symmetries of the geometric aberrations possessed by the first and second aberration-correcting elements. The first and second aberration-correcting elements are so controlled that the order and symmetry of the aberration grasped by the aberration-grasping means are brought into coincidence with the order and symmetry of the combination aberration produced by the aberration-producing means.

In an embodiment of the present invention based on the above-described embodiment, each of the aberration-correcting elements is any one of a multipole element, a deflector, an astigmatic corrector, and a lens.

A further embodiment of the present invention provides a charged-particle beam system for correcting aberrations possessed by a lens disposed in the direction of travel of an electron beam. The charged-particle beam system comprises an aberration corrector for correcting lower-order aberrations, and a multipole element having a length in the direction of travel of the electron beam. A higher-order aberration left in the lens after the lower-order aberrations possessed by the lens have been corrected by the aberration corrector is corrected by a higher-order aberration produced as tilt of the electron beam relative to an optical axis is varied when the beam travels through a field produced by the multipole element. The length of the multipole element taken in the direction of travel of the electron beam is set to such a value that the higher-order aberration left in the lens is corrected.

In a still further embodiment of the present invention, a method of correcting aberration possessed by a lens disposed in the direction of travel of an electron beam in a charged-particle beam system by means of an aberration corrector is provided. The method comprises the steps of: placing plural aberration-correcting elements at intervals along a path of travel of the electron beam; and producing a combination aberration by combining aberrations produced in the aberration-correcting elements to correct a higher-order aberration left in the lens after lower-order aberrations possessed by the lens have been corrected by the aberration corrector.

In a method embodiment of the present invention, a combination aberration is produced which has properties given by an order $(N_1+N_2-1)$ and a symmetry $|S_1+S_2|$ or $|S_2-S_1|$ (where $N_1$ and $S_1$ are an order and a symmetry, respectively, of a geometric aberration produced in a first aberration-correcting element disposed in a front stage in the direction of travel of the electron beam and $N_2$ and $S_2$ are an order and a symmetry, respectively, of a geometric aberration produced in a second aberration-correcting element disposed in a rear stage) by a combination of the orders and symmetries of the geometric aberrations possessed by the first and second aberration-correcting elements. The order and symmetry of the combination aberration are brought into coincidence with the order and symmetry of the higher-order aberration left in the lens, thus correcting the higher-order aberration left in the lens.

A method embodiment of the present invention may further comprise the steps of: grasping an order and a symmetry of a higher-order aberration that is left in the lens and to be corrected; selecting a combination of aberration-correcting elements which produces a combination aberration having properties given by an order $(N_1+N_2-1)$ and a symmetry $|S_1+S_2|$ or $|S_2-S_1|$ from the combinations of plural aberration-correcting elements spaced from each other along the path of travel of the electron beam; and correcting the higher-order aberration left in the lens, using the combination aberration created using the plural aberration-correcting elements.

According to the present invention, higher-order aberrations can be produced with a relatively small number of components. This is effective in correcting higher-order aberrations. Furthermore, it is easy to find a procedure for correcting the residual aberrations. In addition, higher-order aberrations can be corrected.

Other objects and features of the invention will appear in the course of the description thereof, which follows.

DESCRIPTION OF THE PREFERRED EMBODIMENTS

Preferred embodiments of the present invention are hereinafter described with reference to the drawings. After a lens is corrected for an aberration by some aberration corrector, the present invention is intended to correct other higher-order aberration left in the lens. The aberration is corrected by a combination of at least two aberration-producing elements. When the aberration is corrected using two aberration-correcting elements, the geometric aberration orders (hereinafter may be referred to as "aberration orders" or simply as "orders") of the two aberration-correcting elements and the symmetries of the aberrations in the two aberration-correcting elements (hereinafter may be abbreviated "symmetries") are combined.

In particular, two aberration-correcting elements are prepared. The first aberration-correcting element has an aberration order of $N_1$ and a symmetry of $S_1$. The second aberration-correcting element has an aberration order of $N_2$ and a symmetry of $S_2$. An aberration having an order of $N_1+N_2-1$ and a symmetry of $|S_2-S_1|$ is corrected by utilizing a combination aberration produced by the two aberration-correcting elements.

The combination aberration referred to herein is described. It is assumed that a first aberration is produced at some location. The first aberration is propagated some distance, varying the point of incidence. When the first aberration is affected by a second aberration, the combination of the first and second aberrations produces a "combination aberration." In the present invention, aberrations are corrected by making positive use of combination aberrations.

The principles of the aberration corrector and method of aberration correction of the present invention are first described. A complex angle $\Omega$ is given by Eq. (6).

$$\Omega = x + iy$$

$$\overline{\Omega} = x - iy \tag{6}$$

It is assumed that $r=(x,y)$ indicates a position in a direction perpendicular to the electron beam. Let f be the focal length of the objective lens. The complex angle is given by Eq. (7).

$$\Omega = r/f \tag{7}$$

Let $\chi$ be wave aberration. Let C be an aberration coefficient. Generally, wave aberration is given by Eq. (8).

$$\chi(\Omega,\overline{\Omega}) = \mathrm{Re}\{C\Omega^n\overline{\Omega}^m\} = \mathrm{Re}\{\chi(\Omega,\overline{\Omega})\} \tag{8}$$

Where n and m are integers and $\chi$ is defined as $\chi=\mathrm{Re}\{X\}$. As a result of computation, a geometrical aberration can be given by Eq. (9).

$$\frac{\partial \overline{X}}{\partial \Omega} + \frac{\partial X}{\partial \overline{\Omega}} \tag{9}$$

Figure 3A:
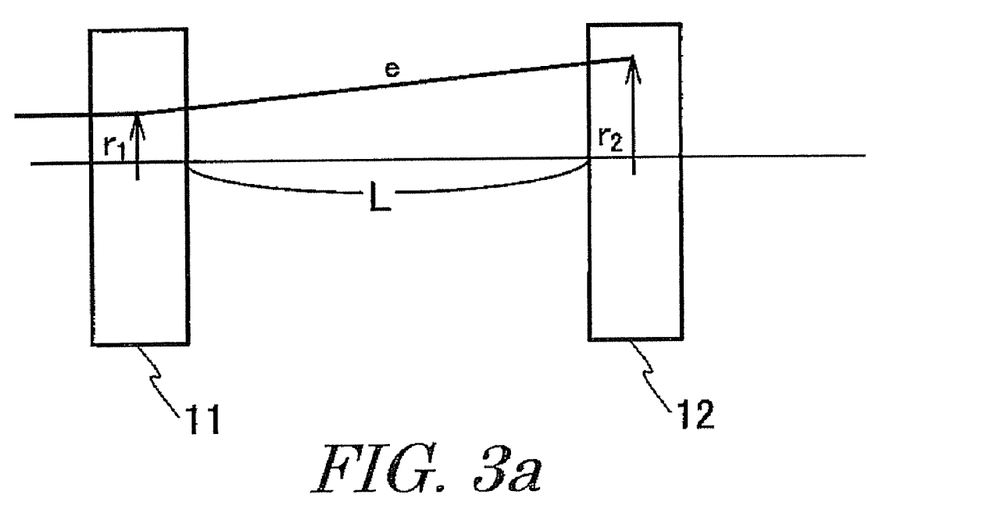
FIGS. 3a and 3b illustrate the principle of the present invention.

FIGS. 3a and 3b illustrate the principles of the present invention. Referring to FIG. 3a, it is assumed that aberrations are produced at a first location 11 and a second location 12 that are spaced by a distance of L. The first location 11 can be regarded as a first aberration-producing element. The second location 12 can be regarded as a second aberration-producing element.

Let $r_1$ and $r_2$ be points of incidence of an electron beam. Using Eq. (9), geometrical aberrations G's at these points are given by Eqs. (10) and (11).

$$G(\Omega) = \overline{n_1 C_1 \Omega^{n_1-1} \overline{\Omega}^{m_1}} \mathbf{1} + m_1 C_1 \Omega^{n_1} \overline{\Omega}^{m_1-1} \tag{10}$$

$$G(\Omega) = \overline{n_2 C_2 \Omega^{n_2-1} \overline{\Omega}^{m_2}} \mathbf{2} + m_2 C_2 \Omega^{n_2} \overline{\Omega}^{m_2-1} \tag{11}$$

The order of each geometrical aberration is the sum of a power of Eq. (12) and a power of Eq. (13).

$$\Omega \tag{12}$$

$$\overline{\Omega} \tag{13}$$

Therefore, the order of the geometrical aberration at the first location 11 is $n_1+m_1-1$, whereas the order of the geometrical aberration at the second location 12 is $n_2+m_2-1$. Using Eqs. (7) and (10), the point of incidence $r_2$ and complex angle $\Omega_2$ at the second location 12 are given by Eqs. (14) and (15).

$$r_2 = r_1 - G(r_1/f)/f \cdot L \tag{14}$$

$$\Omega_2 = \Omega_1 - G_1(\Omega_1)/f^2 \cdot L \tag{15}$$

$$= \Omega_1 - \frac{L}{f^2}\left(n_1 \overline{C_1 \Omega_1^{n_1-1}} \Omega_1^{m_1} + m_1 C_1 \Omega_1^{n_1} \overline{\Omega_1}^{m_1-1}\right)$$

Consequently, by substituting Eq. (15) into Eq. (11), a combination aberration can be calculated as given by Eq. (16).

$$G_2(\Omega_2) = \overline{n_2 C_2 \Omega_2^{n_2-1} \overline{\Omega_2}^{m_2}} + m_2 C_2 \Omega_2^{n_2} \overline{\Omega_2}^{m_2-1} \tag{16}$$

$$= G_2(\Omega_1) - \frac{L}{f^2}\{(n_2-1)n_2 n_1 + n_2 m_2 m_1\}$$

$$C_1 \overline{C_2} \Omega_1^{n_1+m_2-1} \overline{\Omega_1}^{m_1+n_2-2} - \frac{L}{f^2}\{(n_2-1)n_2 m_1 +$$

$$n_2 m_2 n_1\}\overline{C_1 C_2}\Omega_1^{m_1+m_2-1}\overline{\Omega_1}^{n_1+n_2-2} - \frac{L}{f^2}\{n_2 m_2 n_1 +$$

$$(m_2-1)m_2 m_1\}\overline{C_1}C_2\Omega_1^{m_1+n_2-1}\overline{\Omega_1}^{n_1+m_2-2} -$$

$$\frac{L}{f^2}\{n_2 m_2 m_1 + (m_2-1)m_2 n_1\}$$

$$C_1 C_2 \Omega_1^{n_1+n_2-1}\overline{\Omega_1}^{m_1+m_2-2} + \text{higher order terms}$$

The order of the geometrical aberration is the sum of a power of Eq. (17) and a power of Eq. (18).

$$\Omega \tag{17}$$

$$\overline{\Omega} \tag{18}$$

Therefore, it can be seen that every term of Eq. (16) has an order of $(n_1+m_1-1)+(n_2+m_2-1)-1$. That is, the order of a produced combination aberration is obtained by subtracting 1 from the sum of the aberration order at the first location 11 and the aberration order at the second location 12.

Symmetries are next described. Let $S_1$ and $S_2$ be the symmetries of an aberration at the first location 11 and the second location 12, respectively. A combination aberration is given by the following Eq. (19).

$$-\frac{L}{f^2}\{(n_2-1)n_2n_1 + n_2m_2m_1\}C_1\overline{C_2}\Omega_1^{m_1-S_1+m_2-1}\overline{\Omega}_1^{m_1+m_2-S_2-2} - \quad (19)$$

$$\frac{L}{f^2}\{(n_2-1)n_2m_1 + n_2m_2n_1\}\overline{C_1C_2}\Omega_1^{m_1+m_2-1}\overline{\Omega}_1^{m_1+m_2-S_1-S_2-2} -$$

$$\frac{L}{f^2}\{n_2m_2n_1 + (m_2-1)m_2m_1\}\overline{C_1}C_2\Omega_1^{m_1+m_2-S_2-1}\overline{\Omega}_1^{m_1-S_1+m_2-2} -$$

$$\frac{L}{f^2}\{n_2m_2m_1 + (m_2-1)m_2n_1\}C_1C_2\Omega_1^{m_1+m_2-S_1-S_2-1}\overline{\Omega}_1^{m_1+m_2-2} +$$

higher order terms

A symmetry is obtained by taking a power of Eq. (20), adding 1 to the power, subtracting a power of Eq. (21) from the sum, and taking the absolute value of the difference.

$$\overline{\Omega} \quad (20)$$

$$\Omega \quad (21)$$

Hence, the symmetry of a combination aberration is given by $|S_1+S_2|$ or $|S_2-S_1|$.

Let $N_1$ be the aberration order at the first location 11. Let $S_1$ be the symmetry at the first location 11. Let $N_2$ be the aberration order at the second location 12. Let $S_2$ be the symmetry at the second location 12. The above-described facts indicate that the produced combination aberration satisfies the following condition set 1.

order=$N_1+N_2-1$ symmetry=$|S_1+S_2|$ or $|S_2-S_1|$

The principle of the present invention has been described taking the case of FIG. 3a as an example. In this case, an aberration having condition 1 is corrected by making use of a combination aberration created by two aberration-producing elements corresponding to first location 11 and second location 12.

Then, a case using a single multipole element having a length (having a thickness) in the direction of travel of an electron beam is described. An aberration similar to a combination aberration created by the aforementioned two correcting elements (aberration-introducing elements) can be produced even using the single multipole element described above. Using this aberration, an aberration in a lens can be corrected.

Figure 3B:
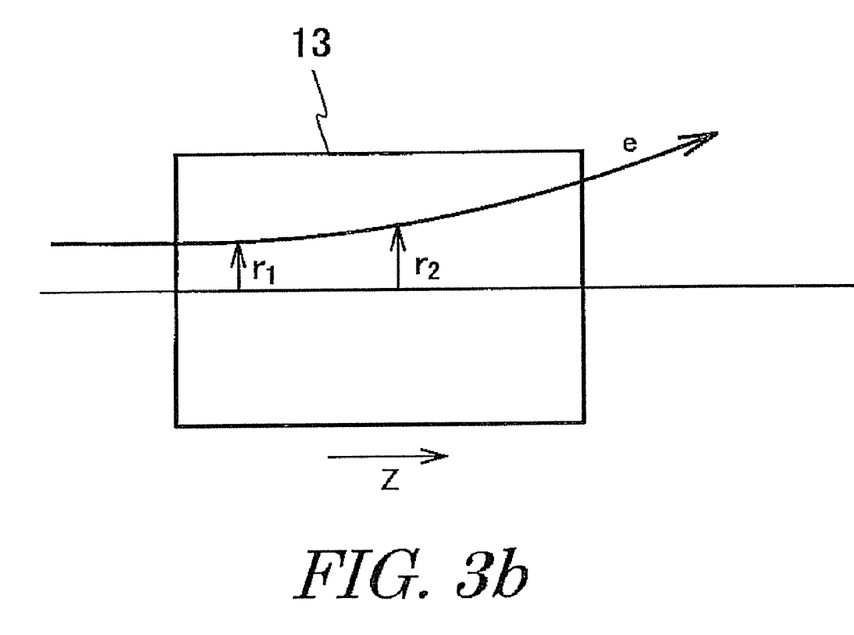

As shown in FIG. 3b, when an electron beam enters a multipole element 13 having a thickness, the point of incidence of the electron beam varies gradually as the beam travels through the field produced by the multipole field having the thickness.

That is, a combination aberration per unit length of the multipole element having a length (having a thickness) in the direction of travel of the electron beam is given by Eq. (22).

$$\tilde{\Gamma} \quad (22)$$

The combination aberration in the multipole element having a length (having a thickness) in the direction of travel of the electron beam is given by Eq. (23).

$$\tilde{\Gamma}(\Omega) = -\frac{1}{f^2}(n_2+m_1-1)(n_2n_1+m_1m_2)C_1\overline{C_2}\Omega_1^{n_1+m_2-1}\overline{\Omega}_1^{n_2+m_1-2} - \quad (23)$$

$$\frac{1}{f^2}(n_1+n_2-1)(n_2m_1+n_1m_2)\overline{C_1}C_2\Omega_1^{m_1+m_2-1}\overline{\Omega}_1^{n_1+n_2-2} -$$

-continued $$\frac{1}{f^2}(n_1+m_2-1)(n_2n_1+m_1m_2)\overline{C_1}C_2\Omega_1^{n_2+m_1-1}\overline{\Omega}_1^{n_1+m_2-2} -$$

$$\frac{1}{f^2}(m_1+m_2-1)(n_2m_1+n_1m_2)C_1C_2\Omega_1^{n_1+n_2-1}\overline{\Omega}_1^{m_1+m_2-2})$$

In this case, the tilt r' of the electron beam caused by the combination aberration is given by Eq. (24).

$$r' = -\frac{1}{f}\int \tilde{\Gamma}(\Omega)dz \quad (24)$$

where z is the thickness (length taken in the direction of travel of the electron beam) of the multipole element.

In the present invention, an aberration produced by a single multipole element having a length (thickness) in the direction of travel of the electron beam is also referred to as a combination aberration. Correction of a higher-order aberration utilizing the combination aberration also falls within the technical scope of the present invention.

Figure 4:
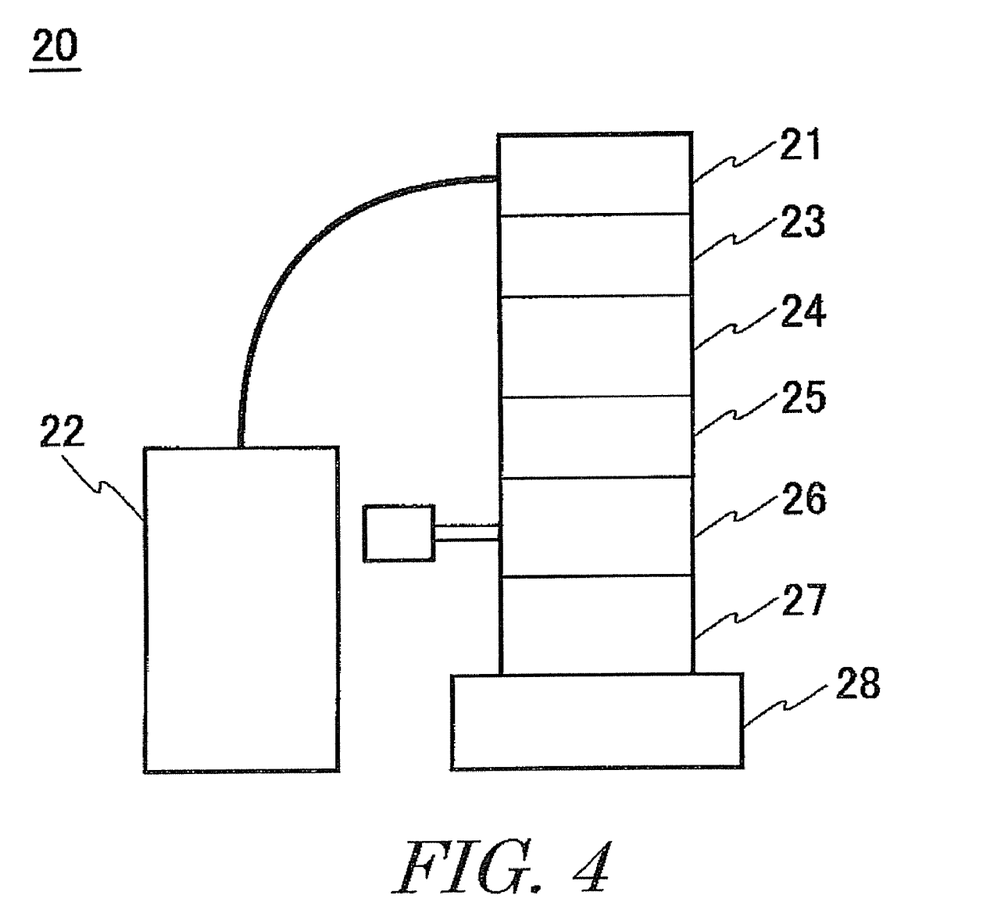
FIG. 4 is a block diagram of a transmission electron microscope using an aberration corrector in its illumination system, showing the structure of the microscope.

While the principles have been described, specific examples of an aberration corrector are described below. FIG. 4 shows the structure of a transmission electron microscope 20 using an aberration corrector in its illumination system.

The microscope has an electron gun 21 using a high-voltage power supply that is controlled by a high-voltage controller 22. Under this condition, the gun 21 produces an electron beam that is converged by a condenser lens 23 including stigmatic correcting elements. The converged beam reaches an aberration corrector 24 in the illumination system. The corrector 24 has various correcting elements including electron beam-deflecting elements and multipole elements.

The electron beam having aberrations which have been corrected by the aberration corrector 24 in the illumination system is converged by another condenser lens 25 including electron beam-deflecting elements. The beam reaches an objective lens and specimen stage 26. The objective lens causes the beam to hit a specimen placed on the specimen stage. The beam transmitted through the specimen lying on the specimen stage is projected by intermediate and projector lenses 27 and reaches an observation chamber 28, where an image of the specimen is observed. For example, the image is photographed by a camera.

Figure 5:
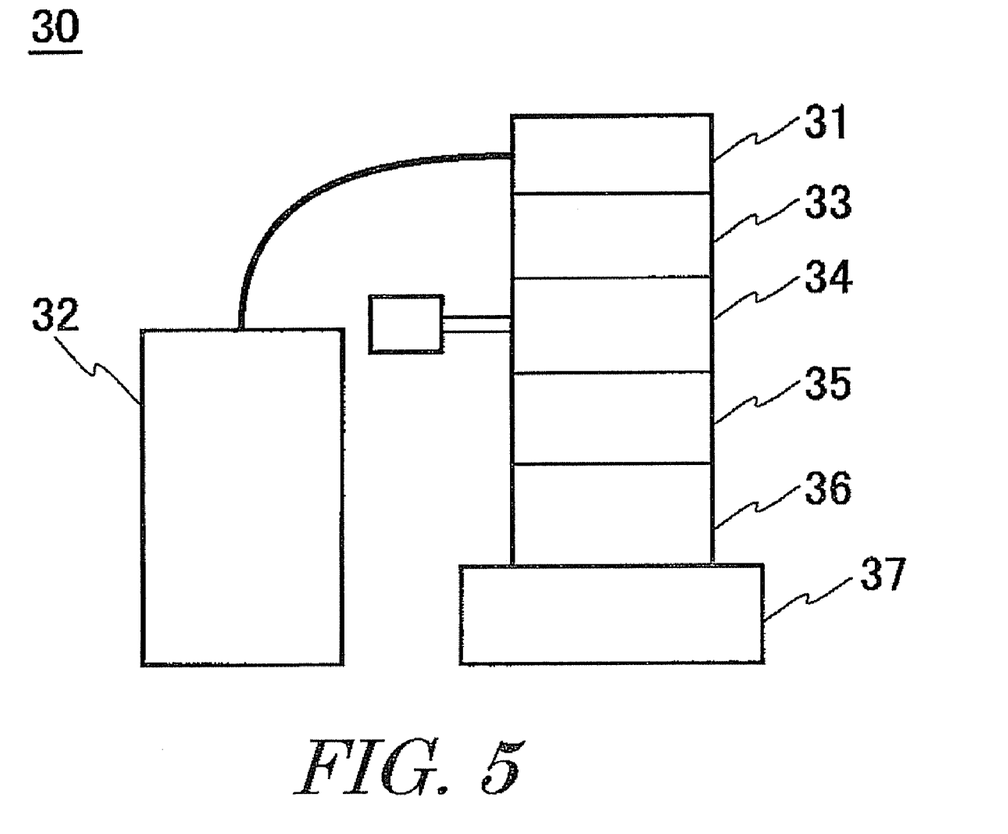
FIG. 5 is a block diagram of a transmission electron microscope using an aberration corrector in its imaging system, showing the structure of the microscope.

FIG. 5 shows the structure of a transmission electron microscope 30 using an aberration corrector in its imaging system. The microscope has an electron gun 31 producing an electron beam while the high-voltage power supply of the gun is controlled by a high-voltage controller 32. The beam is converged by a condenser lens 33 including stigmatic correcting elements. The converged beam reaches an objective lens and specimen stage 34. The objective lens causes the beam to impinge on a specimen placed on the specimen stage. The beam transmitted through the specimen lying on the stage enters an aberration corrector 35 in the imaging system.

The aberration corrector 35 in the imaging system has various correcting elements including electron beam-deflecting elements and multipole elements. The electron beam having aberrations which have been corrected by the corrector 35 in the imaging system is projected by intermediate and projector lenses 36 and reaches an observation chamber 37, where an image of the specimen is observed. For example, the image is photographed by a camera.

Furthermore, a transmission electron microscope may be built using a combination of the aberration corrector 24 (FIG. 4) in the illumination system and the aberration corrector 35 in the imaging system.

In one feature of the present invention, two of various aberration-correcting elements are used to produce a combination aberration. These various aberration-correcting elements include aberration-correcting elements included in the aberration corrector within the illumination system, aberration-correcting elements included in the aberration correctors incorporated in the deflection system and imaging system, respectively, aberration-correcting elements for correcting spherical aberrations in the deflection system, aberration-correcting elements for correcting spherical aberration in the objective lens, deflection aberration-correcting elements and stigmatic correcting elements incorporated in the condenser lenses, deflecting aberration-correcting elements and stigmatic correcting elements incorporated in the intermediate lenses, and newly introduced aberration-correcting elements.

Figure 6:
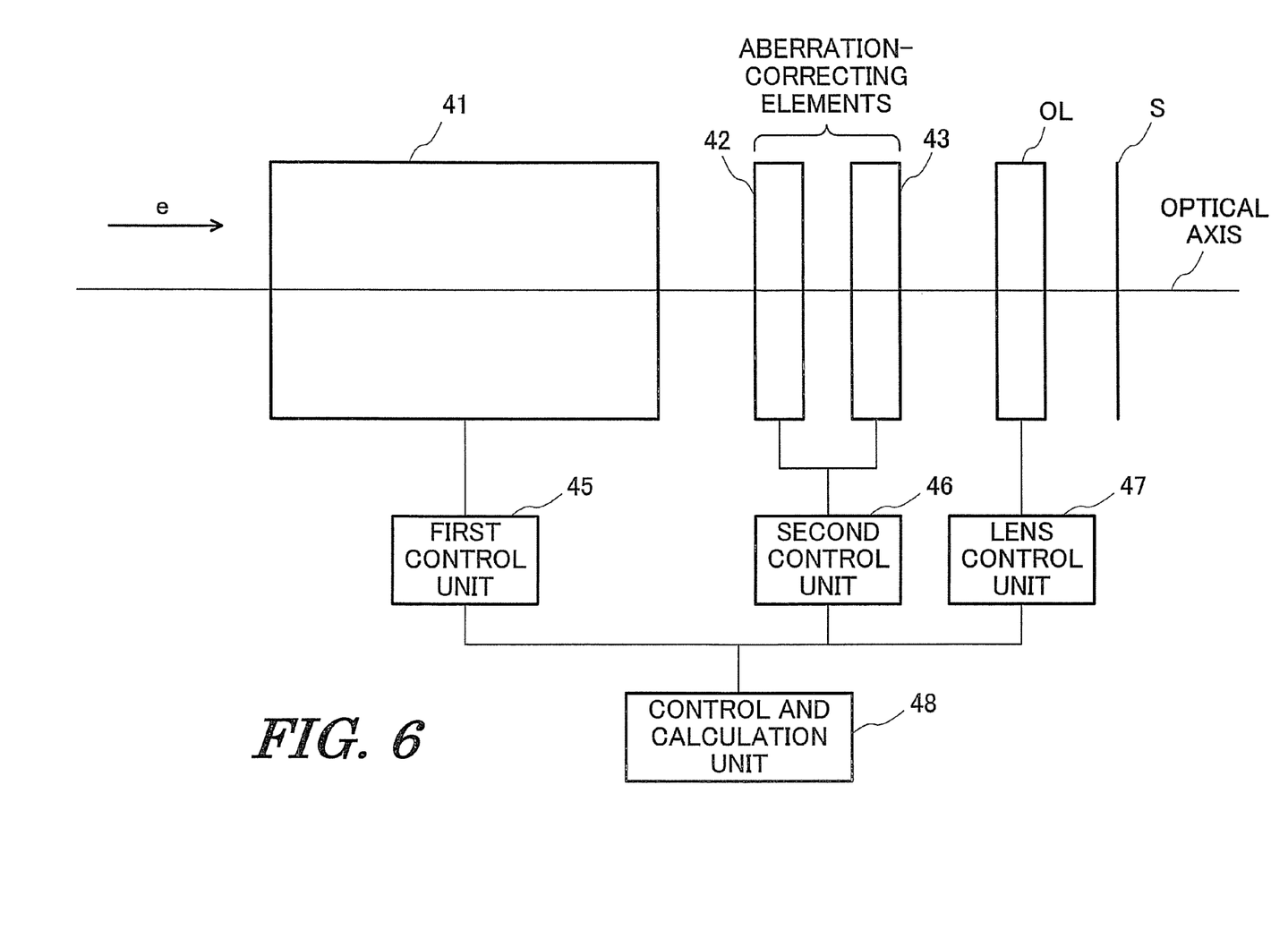
FIG. 6 is a diagram illustrating an example of structure of an aberration corrector associated with the present invention and the operation.
Figure 7:
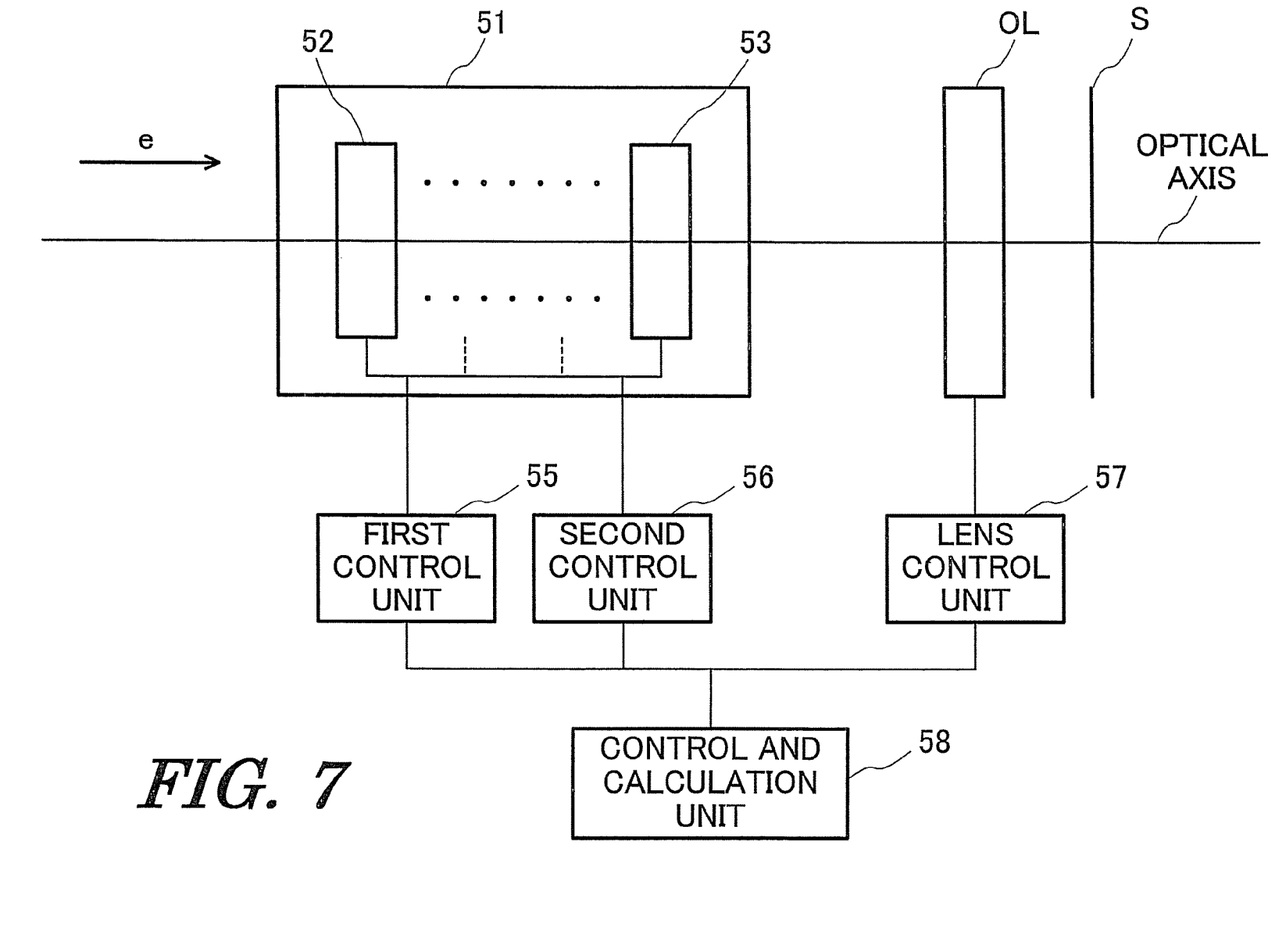
FIG. 7 is a diagram illustrating another example of structure of an aberration corrector associated with the present invention and the operation.

An example of structure of an illumination system aberration corrector associated with the present invention and the operation are described by referring to FIGS. 6 and 7.

In FIG. 6, an aberration corrector 41, aberration-correcting elements 42, 43, an objective lens OL, and a specimen S are arranged on an optical axis. A first control unit, a second control unit, and a lens control unit operate to apply necessary voltages to the aberration corrector 41, aberration-correcting elements 42, 43, and objective lens OL, respectively. These control units are made to perform required operations under control of a control and calculation unit 48. The aberration corrector 41 and aberration-correcting elements 42, 43 correspond to the illumination system aberration corrector 24 of FIG. 4.

In FIG. 6, the first control unit applies a control voltage to the aberration corrector such that spherical aberration (geometric third-order aberration), for example, possessed by the objective lens OL is corrected. At this time, higher-order aberrations will still be left in the electron beam hitting the specimen S unless the aberration-correcting elements are in operation. The second control unit applies control voltages to the aberration-correcting elements 42 and 43 to grasp what kinds of higher-order aberrations are left from observation of an image of the specimen and to produce a combination aberration capable of canceling out a residual higher-order aberration.

FIG. 7 is a diagram illustrating another example of structure and its operation. In FIG. 7, an aberration corrector 51, an objective lens OL, and a specimen S are arranged on an optical axis. Multipole elements 52 and 53 are built in the aberration corrector 51. First and second control units operate to apply necessary voltages to the multipole elements 52 and 53. A lens control unit operates to apply a necessary voltage to the objective lens OL. These control units are made to perform necessary operations under control of a control and calculation unit 58. Where three or more multipole elements are built in the aberration corrector 51, any arbitrary combination may be created from them and controlled by the second control unit. The aberration corrector 51 corresponds to the illumination system aberration corrector 24 of FIG. 4.

In FIG. 7, the first control unit applies a control voltage to the aberration corrector such that the spherical aberration (geometric third-order aberration), for example, possessed by the objective lens OL is corrected. At this time, higher-order aberrations will still be left in the electron beam hitting the specimen S unless the second control unit is in operation.

The second control unit applies control voltages to the multipole elements 52 and 53 to grasp what kinds of higher-order aberrations are left from observation of an image of the specimen and to produce a combination aberration capable of canceling out a residual higher-order aberration. Superimposition of the voltages from the first and second control units is applied to the multipole elements 52 and 53. That is, the multipole elements 52 and 53 act also as aberration-correcting elements for producing a combination aberration.

Actual examples of the operation are next described by referring to Tables 1-3. The notation of aberrations is first described by referring to Table 1.

TABLE 1

| Aberration | Symbol | Wave aberration function $x(\Omega)$ | Geometrical aberration | Beam pattern |
|---|---|---|---|---|
| Defocus | $O_2$ | $\mathrm{Re}\left\{\frac{1}{2}O_2\Omega\bar{\Omega}\right\}$ | $O_2\Omega$ | ○○○∘○○ |
| 2-fold astigmatism | $A_2$ | $\mathrm{Re}\left\{\frac{1}{2}A_2\bar{\Omega}^2\right\}$ | $A_2\bar{\Omega}$ | ∅ ⟋ |
| Axial coma | $P_3$ | $\mathrm{Re}\left\{\frac{1}{3}P_3\Omega\bar{\Omega}^2\right\}$ | $\frac{2}{3}P_3\Omega\bar{\Omega}+\frac{1}{3}P_3\Omega^2$ | ⟋ |
| 3-fold astigmatism | $A_3$ | $\mathrm{Re}\left\{\frac{1}{3}A_3\bar{\Omega}^3\right\}$ | $A_3\bar{\Omega}^2$ | △ |
| Sperical aberration | $O_4$ | $\mathrm{Re}\left\{\frac{1}{4}O_4\Omega^2\bar{\Omega}^2\right\}$ | $O_4\Omega^2\bar{\Omega}$ | ◉ |
| Star aberration | $Q_4$ | $\mathrm{Re}\left\{\frac{1}{4}Q_4\Omega\bar{\Omega}^3\right\}$ | $\frac{1}{4}\bar{Q}_4\Omega^3+\frac{3}{4}Q_4\Omega\bar{\Omega}^2$ | ⌀ |
| 4-fold astigmatism | $A_4$ | $\mathrm{Re}\left\{\frac{1}{4}A_4\bar{\Omega}^4\right\}$ | $A_4\bar{\Omega}^3$ | □◇ |
| 4th order axial coma | $P_5$ | $\mathrm{Re}\left\{\frac{1}{5}P_5\Omega^2\bar{\Omega}^3\right\}$ | $\frac{3}{5}P_5\Omega^2\bar{\Omega}^2+\frac{2}{5}P_5\bar{\Omega}\Omega^3$ | ⟋ |

TABLE 1-continued

| Aberration | Symbol | Wave aberration function x(Ω) | Geometrical aberration | Beam pattern |
|---|---|---|---|---|
| Three lobe | $R_6$ | $Re\left\{\frac{1}{5}R_5\Omega\overline{\Omega}^4\right\}$ | $\frac{1}{5}\overline{R_5}\Omega^4 + \frac{4}{5}R_5\Omega\overline{\Omega}^3$ | △ |
| 5-fold astigmatism | $A_5$ | $Re\left\{\frac{1}{5}A_5\overline{\Omega}^5\right\}$ | $A_5\overline{\Omega}^4$ | ⬠ |
| 5th order spherical aberration | $O_6$ | $Re\left\{\frac{1}{6}O_6\Omega^3\overline{\Omega}^3\right\}$ | $O_6\Omega^3\overline{\Omega}^2$ | ◎ |
| 6-fold astigmatism | $A_6$ | $Re\left\{\frac{1}{6}A_6\overline{\Omega}^6\right\}$ | $A_6\overline{\Omega}^5$ | ⬡ |

Complex angle $\Omega = \alpha \exp(i\theta)$
$\alpha$: Angle
$\theta$: Azimuth

The kinds of aberrations listed in Table 1 are: defocus, 2-fold astigmatism, axial coma, 3-fold astigmatism, spherical aberration, star aberration, 4-fold astigmatism, 4th-order axial coma, three-lobe aberration, 5-fold astigmatism, 5th-order spherical aberration, and 6-fold astigmatism. Described for each kind of aberration are: symbol, wave aberration function $\chi(\Omega)$, geometrical aberration, and beam pattern. Two-fold astigmatism $A_2$, 3-fold astigmatism $A_3$, 4-fold astigmatism $A_4$, 5-fold astigmatism $A_5$, and 6-fold astigmatism $A_6$ are primary aberrations. The 2-fold astigmatism $A_2$ and star aberration $Q_4$ have the same two-fold symmetry but are different in order of geometrical aberration. That is, $A_2$ and $Q_4$ have first-order geometrical aberration and third-order geometrical aberration, respectively. The three-fold astigmatism $A_3$ and three-lobe aberration $R_5$ have the same three-fold symmetry but are different in order of geometrical aberration. That is, $A_3$ and $R_5$ have second-order geometrical aberration and fourth-order aberration, respectively.

The symmetries of the various aberrations and geometrical aberrations are listed in Table 2. The symmetries are arranged vertically in the left end. The orders of geometrical aberrations are arranged horizontally in the top end.

TABLE 2

| Symmetry | Order of geometrical aberration | | | | | |
|---|---|---|---|---|---|---|
|  | 0 | 1 | 2 | 3 | 4 | 5 |
| 0 |  | $O_2$ |  | $O_4$ |  | $O_6$ |
| 1 |  |  | $P_3$ |  | $P_5$ |  |
| 2 |  | $A_2$ |  | $Q_4$ |  | $Q_6$ |
| 3 |  |  | $A_3$ |  | $R_5$ |  |
| 4 |  |  |  | $A_4$ |  | $S_6$ |
| 5 |  |  |  |  | $A_5$ |  |
| 6 |  |  |  |  |  | $A_6$ |

For example, defocus $O_2$ has 0-fold symmetry and first-order geometrical aberration. Similarly, axial coma $P_3$ has a 1-fold symmetry and second-order geometrical aberration. Star aberration $Q_4$ has a 2-fold symmetry and third-order geometrical aberration.

It is now assumed, for example, that the aberration to be corrected is 4-fold astigmatism $A_4$. It can be seen from Table 2 that 4-fold astigmatism $A_4$ has a 4-fold symmetry and third-order geometrical aberration. In this case, aberrations which satisfy the condition set 1 described above are 2-fold astigmatism $A_2$ and star aberration $Q_4$. These aberrations are used. Conditions for $A_2$ and $Q_4$, i.e., $n_1=0$, $m_1=2$, $n_2=1$, and $m_2=3$, are substituted into Eq. (11). This gives rise to the following Eq. (25).

$$-6\frac{L}{f^2}A_2Q_4\overline{\Omega}_1^3 - \left(6\frac{L}{f^2}A_2\overline{Q_4} + 12\frac{L}{f^2}\overline{A_2}Q_4\right)\Omega_1^2\overline{\Omega}_1^1 \quad (25)$$

In this Eq. (25), the first term expressed by the Eq. (26) is 4-fold astigmatism $A_4$, while the second term expressed by the Eq. (27) is spherical aberration $O_4$.

$$\overline{\Omega}_1^3 \quad (26)$$

$$\Omega_1^2\overline{\Omega}_1^1 \quad (27)$$

That is, spherical aberration $O_4$ and 4-fold astigmatism $A_4$ are produced from 2-fold astigmatism $A_2$ and star aberration $Q_4$. With respect to the 4-fold astigmatism $A_4$, the aberration is corrected using a combination aberration by making use of the first term.

Combination aberrations are produced using the orders and symmetries of the various aberrations listed in Table 2 and by referring to the first aberration-correcting element (in the row) and the second aberration-correcting element (in the column). These combination aberrations can be summarized as in the following Table 3.

TABLE 3

| First aberration(Row), Second aberration(Column) | | | | | | | | |
|---|---|---|---|---|---|---|---|---|
|  | $O_2$ | $A_2$ | $P_3$ | $A_3$ | $O_4$ | $A_4$ | $Q_4$ | $R_5$ |
| $O_2$ | $O_2$ | $A_2$ | $P_3, A_3$ | $A_3$ | $O_4$ | $A_4$ | $Q_4$ | $R_5$ |
| $A_2$ | $A_2$ | $O_2$ | $P_3$ | $P_3$ | $Q_4$ | $Q_4$ | $Q_4, A_4$ | $P_5, A_5$ |
| $P_3$ | $P_3$ | $P_3, A_3$ | $O_4, Q_4$ | $A_4, Q_4$ | $P_5$ | $A_5, R_5$ | $P_5, R_5$ | $Q_6, S_6$ |
| $A_3$ | $A_3$ | $P_3$ | $A_4, Q_4$ | $O_4$ | $R_5$ | $P_5$ | $P_5, A_5$ | $O_6, A_6$ |
| $O_4$ | $O_4$ | $Q_4$ | $P_5$ | $R_5$ | $O_6$ | $S_6$ | $Q_6$ | ☆ |
| $A_4$ | $A_4$ | $Q_4$ | $A_5, R_5$ | $P_5$ | $S_6$ | $O_6$ | $Q_6, A_6$ | ☆ |
| $Q_4$ | $Q_4$ | $O_4, A_4$ | $P_5, R_5$ | $P_5, A_5$ | $Q_6$ | $Q_6, A_6$ | $Q_6, S_6$ | ☆ |
| $R_5$ | $R_5$ | $P_5, A_5$ | $Q_6, S_6$ | $O_6, A_6$ | ☆ | ☆ | ☆ | ☆ |

☆: Aberration higher than 6th order

Where one aberration included in Table 3 should be corrected, the correction can be achieved by preparing first and second aberrations, respectively, in the row and the column.

The procedure of corrective processing is summarized as follows. In step S1, order and symmetry of an aberration to be corrected are grasped. In step S2, two correcting elements (multipole elements or deflecting elements) that are spaced from each other by a distance of L are prepared. The correcting elements satisfy the condition set 1. In step S3, the aberration is corrected using the two correcting elements.

For example, three-lobe aberration $R_5$ can be corrected by preparing spherical aberration $O_4$ and 3-fold astigmatism $A_3$ as the first and second aberration-correcting elements, respectively. Furthermore, fifth-order spherical aberration $O_6$ can be corrected by preparing spherical aberration $O_4$ as the first aberration-correcting element and also as the second correcting element. In addition, fourth-order coma $P_5$ and 5-fold astigmatism $A_5$ can be corrected by preparing 2-fold astigmatism $A_2$ and three-lobe aberration $R_5$ as the first and second correcting elements, respectively.

In the description provided so far, a combination of two aberration-producing elements is used to make use of a combination aberration. The present invention can also be applied to a combination of three or more aberration-producing elements.

In a multipole field having a thickness (i.e., a length in the direction of travel of an electron beam), two aberration-producing elements can be considered to be arranged continuously. Because the point of incidence varies with the progress of the electron beam, an electrooptical effect similar to a combination aberration produced by the two aberration-correcting elements as described so far is produced. A combination aberration is produced on the sample principle as the principle of the present embodiment. In this way, the two aberration-correcting elements of the present embodiment are applied to a combination aberration produced by a multipole element having a thickness. An aberration is corrected by the produced combination aberration. This constitutes a modified embodiment of the present invention.

In the case of a multipole element having a thickness or in cases where three or more multipole elements are combined, the combination aberration itself is the original aberration (first or second aberration). An aberration satisfying the condition set 1 can be corrected from the order and symmetry of the combination aberration. Correction of an aberration using this higher-order aberration constitutes a further modified embodiment of the present invention.

Having thus described our invention with the detail and particularity required by the Patent Laws, what is desired protected by Letters Patent is set forth in the following claims.

The invention claimed is:

1. A charged-particle beam system comprising:
an aberration corrector for correcting lower-order aberrations possessed by a lens disposed in the direction of travel of an electron beam; and
at least two aberration-correcting elements spaced apart from each other along a path of travel of the electron beam,
wherein a higher-order aberration left in said lens after the lower-order aberrations possessed by the lens have been corrected by said aberration corrector is corrected using a combination aberration created by a combination of aberrations produced in said at least two aberration-correcting elements.

2. A charged-particle beam system comprising:
an aberration corrector for correcting lower-order aberrations possessed by a lens disposed in the direction of travel of an electron beam;
at least two aberration-correcting elements disposed in said aberration corrector; and
first and second control units for applying control voltages to the aberration-correcting elements disposed in the aberration corrector,
wherein said second control unit produces its control voltage independent of said first control unit in such a way that the control voltage produced by the second control unit can be superimposed on the control voltage which is produced by the first control unit and to be applied to the aberration-correcting elements disposed in the aberration corrector, and
wherein a higher-order aberration left in said lens after the lower-order aberrations possessed by the lens have been corrected by the control voltage applied by said first control unit is corrected using a combination aberration created by a combination of aberrations produced in the aberration-correcting elements disposed in the aberration corrector by the control voltage applied by the second control unit.

3. A charged-particle beam system as set forth in any one of claims 1 and 2, further comprising:
aberration-grasping means for grasping an order and a symmetry of a higher-order aberration that is left in said lens and to be corrected; and
aberration-producing means for producing a combination aberration having properties given by an order ($N_1+N_2-1$) and a symmetry $|S_1+S_2|$ or $|S_2-S_1|$ (where $N_1$ and $S_1$ are an order and a symmetry, respectively, of a geometric aberration produced in a first aberration-correcting element disposed in a front stage along the direction of travel of the electron beam and $N_2$ and $S_2$ are an order and a symmetry, respectively, of a geometric aberration produced in a second aberration-correcting element disposed in a rear stage) by a combination of the orders and symmetries of the geometric aberrations possessed by the first and second aberration-correcting elements,
wherein said first and second aberration-correcting elements are so controlled that the order and symmetry of the aberration grasped by said aberration-grasping means are brought into coincidence with the order and symmetry of the combination aberration produced by said aberration-producing means.

4. A charged-particle beam system as set forth in any one of claims 1 and 2, wherein each of said aberration-correcting elements is any one of a multipole element, a deflector, an astigmatic corrector, and a lens.

5. A charged-particle beam system comprising:
an aberration corrector for correcting lower-order aberrations possessed by a lens disposed in the direction of travel of an electron beam; and
a multipole element having a length in the direction of travel of the electron beam,
wherein a higher-order aberration left in said lens after the lower-order aberrations possessed by the lens have been corrected by said aberration corrector is corrected by a higher-order aberration produced as tilt of the electron beam relative to an optical axis is varied when the beam travels through a field produced by the multipole element, and
wherein the length of said multipole element taken in the direction of travel of the electron beam is set to such a value that the higher-order aberration left in said lens is corrected.

6. A method of correcting aberration possessed by a lens disposed in the direction of travel of an electron beam in a charged-particle beam system by means of an aberration corrector, said method comprising the steps of:

placing plural aberration-correcting elements at intervals along a path of travel of the electron beam; and producing a combination aberration by combining aberrations produced in the aberration-correcting elements to correct a higher-order aberration left in said lens after lower-order aberrations possessed by the lens have been corrected by said aberration corrector.

7. A method of correcting aberration in a charged-particle beam system as set forth in claim 6, comprising the steps of:

producing a combination aberration having properties given by an order $(N_1+N_2-1)$ and a symmetry $|S_1+S_2|$ or $|S_2-S_1|$ (where $N_1$ and $S_1$ are an order and a symmetry, respectively, of a geometric aberration produced in a first aberration-correcting element disposed in a front stage in the direction of travel of the electron beam and $N_2$ and $S_2$ are an order and a symmetry, respectively, of a geometric aberration produced in a second aberration-correcting element disposed in a rear stage) by a combination of the orders and symmetries of the geometric aberrations possessed by said first and second aberration-correcting elements; and bringing the order and symmetry of the combination aberration into coincidence with the order and symmetry of the higher-order aberration left in the lens, thus correcting the higher-order aberration left in the lens.

8. A method of correcting aberration as set forth in claim 7, comprising the steps of:

grasping an order and a symmetry of a higher-order aberration that is left in said lens and to be corrected;

selecting a combination of aberration-correcting elements which produces a combination aberration having properties given by an order $(N_1+N_2-1)$ and a symmetry $|S_1+S_2|$ or $|S_2-S_1|$ from the combinations of plural aberration-correcting elements spaced from each other along the path of travel of the electron beam; and correcting the higher-order aberration left in the lens, using the combination aberration created using the plural aberration-correcting elements.

* * * * *